United States Patent [19]

Marrah et al.

[11] Patent Number: 5,028,882

[45] Date of Patent: Jul. 2, 1991

[54] MULTIPLE OUTPUT OPERATIONAL AMPLIFIER

[75] Inventors: Jeffrey J. Marrah; Gregory J. Manlove, both of Kokomo; Richard A. Kennedy, Russiaville, all of Ind.

[73] Assignee: Delco Electronics Corporation, Kokomo, Ind.

[21] Appl. No.: 497,289

[22] Filed: Mar. 22, 1990

[51] Int. Cl.[5] .............................................. H03F 3/45
[52] U.S. Cl. .................................... 330/254; 330/260; 330/295; 330/84
[58] Field of Search ...................... 330/84, 124 R, 146, 330/148, 253, 254, 260, 275, 295, 301

[56] References Cited

U.S. PATENT DOCUMENTS 4,301,420 11/1981 Sugawara ...................... 330/295 X Primary Examiner—James B. Mullins
Attorney, Agent, or Firm—Albert F. Duke

[57] ABSTRACT

A differential operational amplifier comprises a differential input circuit that provides a differential output signal to a plurality of independent output circuits. The gains of the differential input circuit and one output circuit are set by a fixed bias source. A variable bias source controlled by an external signal determines the gain of each other output circuit so that various attenuation characteristics are obtained in the other output circuits without affecting the operating conditions of the operational amplifier. A feedback element between the output of the one output circuit and the differential input circuit assures gain stability.

19 Claims, 2 Drawing Sheets

MULTIPLE OUTPUT OPERATIONAL AMPLIFIER

FIELD OF THE INVENTION

This invention relates to amplifiers and in particular to integrated circuit operational amplifiers.

BACKGROUND OF THE INVENTION

Operational amplifiers, because of their versatility and predictability of operation, are extremely useful building blocks in both analog and digital circuit applications. Stability is generally provided in such amplifiers by external feedback so that variations in gain don't affect circuit performance. Dynamic adjustment of the gain of an operational amplifier is not readily achieved.

There are circuit applications, however, in which it is desirable to provide convenient and continuous control (attenuation or amplification) of output signals of an operational amplifiers while maintaining the stability of operation provided by fixed feedback circuitry. In one application, for example, the effective resistance of a switched capacitor circuit is controlled by varying the level of voltage which is available to charge the capacitor. One known way of providing controlled attenuation of the output of an operational amplifier is to use a bipolar circuit to convert the amplifier output voltage to a current and to employ a Gilbert Cell in which current is steered to a load resistor as a function of applied control voltage. Gilbert Cells are described in a book entitled "Analysis and Design of Analog Integrated Circuits", Paul R. Gray and Robert G. Meyer, 2nd Edition, Page 593, 1984, John Wiley & Sons. Such an arrangement, however, has serious technical complications such as inherent distortion problems in the required bipolar voltage to current converter and the need for a logarithmic differential control voltage.

SUMMARY OF THE INVENTION

The invention is directed to an operational amplifier arrangement having a single differential input circuit which receives an input signal and supplies the same amplified signal to each of at least two independent output circuits. A fixed bias provides the operating parameters for the differential signal input circuit and one of the at least two independent output circuits. A variable bias is applied to other independent output circuits to provide continuously adjustable signal gains.

In accordance with one aspect of the invention, the operation of at least one of the output circuits is adjustable as a function of an applied control voltage.

In accordance with another aspect of the invention, a feedback element between the one output circuit and the differential input circuit maintains stable operation of the operational amplifier while the operation of other output circuits are adjusted through external controls.

In an illustrative embodiment of the invention, an integrated circuit operational amplifier having variable attenuation comprises a single differential input circuit having at least one input and first and second outputs, and a pair of independent output circuits. An input signal is amplified in the differential input circuit and the differential signal between its first and second outputs are applied in parallel to each output circuit. The gains of the differential input circuit and one output circuit are maintained at a fixed value determined by a fixed bias source. The gain of the other output circuit is controlled by a continuously adjustable control voltage. The output of the fixed gain output stage is fed back to the differential input circuit so that the stability of the operational amplifier is assured while the gain of the other output circuit is varied responsive to the adjustable control voltage to provide variable attenuation.

Viewed from another aspect, the present invention is directed to an amplifier comprising a differential input circuit having first and second inputs and first and second outputs and first and second output circuits each having a first and second inputs and an output. First and second amplifier input terminals are coupled to the first and second inputs of the differential input circuit, respectively. The outputs of the first and second output circuits are coupled to first and second amplifier output terminals, respectively. The first and second outputs of the differential input circuit are coupled to the first and second inputs, respectively, of the first output circuit. The first and second outputs of the differential input circuit are coupled to the first and second inputs, respectively, of the second output circuit. The differential input circuit and the first output circuit each have a fixed bias terminal which is adapted to be coupled to a fixed bias source. The second output circuit has a variable bias terminal which is adapted to be coupled to a variable bias source.

The invention will be better understood from the following more detailed description taken with the accompanying drawings and claims.

DETAILED DESCRIPTION

Figure 1:
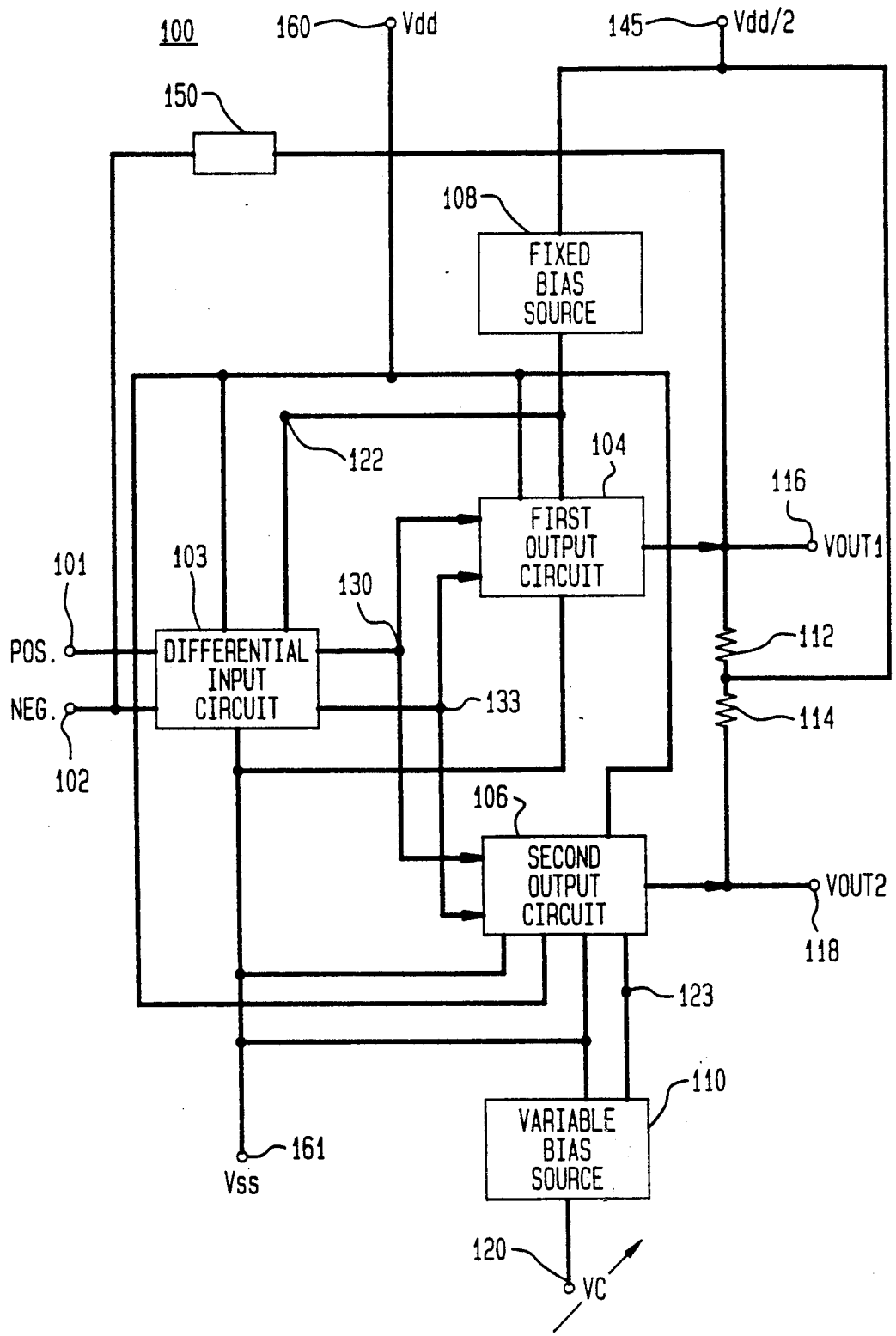
FIG. 1 is a block diagram of a multiple output operational amplifier in accordance with this invention.

Referring now to FIG. 1, there is shown an amplifier 100 in accordance with the invention. Amplifier 100 comprises a differential input circuit 103, a first output circuit 104, a second output circuit 106, a fixed bias source 108, a variable bias source 110, first and second load impedances 112 and 114 and a feedback element 150. A first input terminal 101 of amplifier 100 is coupled to a first input of differential input circuit 103 and is shown coupled to an input signal POS. A second input terminal 102 of amplifier 100 is coupled to a second input of differential input circuit 103 and is shown coupled to an input signal NEG. Amplifier 100 generates a first output signal VOUT1 at a first output terminal 116 of amplifier 100 which is coupled to an output of the first output circuit 104, to a first terminal of load impedance 112, and to a first terminal of feedback element 150. Amplifier 100 generates a second output signal VOUT2 at a second output terminal 118 of amplifier 100 which is coupled to an output of second output circuit 106 and to a first terminal of load impedance 114. First power supply terminals of the differential input circuit and the first and second output circuits 104 and 106 are coupled to a power supply Vdd and to a terminal 160. Second terminals of load impedances 112 and 114 are coupled to a first power supply terminal of fixed bias source 108, to a power supply Vdd/2 and to a terminal 145. An input of variable bias source 110 is coupled to a variable power supply VC (shown as VC with an arrow therethrough) and to a terminal 120.

A first output terminal of differential input circuit 103 is coupled to first inputs of first and second output circuits 104 and 106 and to a terminal 130. A second output terminal of differential input circuit 103 is coupled to second inputs of first and second output circuits 104 and 106 and to a terminal 133. An output of fixed bias source 108 is coupled to power supply inputs of first output circuit 104 and differential input circuit 103 and to terminal 122. An output of variable bias source 110 is coupled to a power supply input of second output circuit 106 and to a terminal 123. A second terminal of feedback element 150 is coupled to terminal 102.

Differential input circuit 103 receives input signals POS and NEG from terminals 101 and 102, respectively, and forms an amplified signal corresponding to the difference between signals NEG and POS. The amplified differential signal appears across output terminals 130 and 133. The amplified signal from terminals 130 and 133 is applied to first output circuit 104 and to second output circuit 106. Signal VOUT1 is generated in the first output circuit 104 and appears across load impedance 112 between lead 116 and terminal 145. Terminal 145 is effective as an A.C. ground. A separate output signal VOUT2 is obtained from the second output circuit 106 and appears across load impedance 114 between terminal 118 and terminal 145.

Each of output circuits 104 and 106 operates independently in response to the bias voltages applied thereto from bias sources 108 and 110, respectively. Signal VOUT1 and VOUT2 are amplified versions of the signal corresponding to the difference between signals POS and NEG. The magnitude of signal VOUT1 from output circuit 104, which is controlled by fixed bias source 108, is independent of the magnitude of signal VOUT2 from output circuit 106, which is controlled by variable bias source 110. The output of fixed bias source 108 supplies a bias control voltage to differential input circuit 103 and to first output circuit 104. The gain of output circuit 104 is maintained at a prescribed level determined by fixed bias source 108. Variable (adjustable) bias source 110, which controls the gain of second output circuit 106, receives a control voltage from the power supply VC. Control voltage VC may be continuously adjusted so that the gain of second output circuit 106 is adjustable. It is to be understood that additional output circuits substantially identical to second output circuit 106 may be added to provide a plurality of output signals each controllable from a separate adjustable power supply like VC.

As is well known in the art, the gain of an operational amplifier is generally stabilized by providing a feedback path between its output and its input. Such a feedback path, however, interferes with any attempted adjustment of the gain by a bias source. As aforementioned, there are circuit applications in which a bias controlled variable signal from an operational amplifier is required as in a switched capacitor arrangement. In accordance with the invention, a bias controlled variable signal voltage is produced by an operational amplifier. The gain stability of the operational amplifier is assured by providing a feedback path between a fixed biased output stage and the input stage, while the gain of a variable biased output stage provides the needed bias controlled variable voltage. In amplifier circuit 100 of FIG. 1, feedback element 150 is shown coupled between terminal 116 at the output of the fixed biased first output circuit 104 and input terminal 102 so that the operation of amplifier 100 is stabilized. Other operational amplifier feedback arrangements well known in the art may also be employed. Second output circuit is controlled by voltage VC through adjustable bias source 110 whereby its gain is continuously adjustable. In this way, a bias controlled variable voltage is produced by a gain stabilized operational amplifier. It is apparent that more variable bias controlled output circuits similar to second output circuit 106 may be added to amplifier 100 as long as one fixed bias controlled circuit such as output circuit 104 is used. The addition of a feedback path between the output of the first output circuit 104 and the differential input circuit further assures gain stability.

Figure 2:
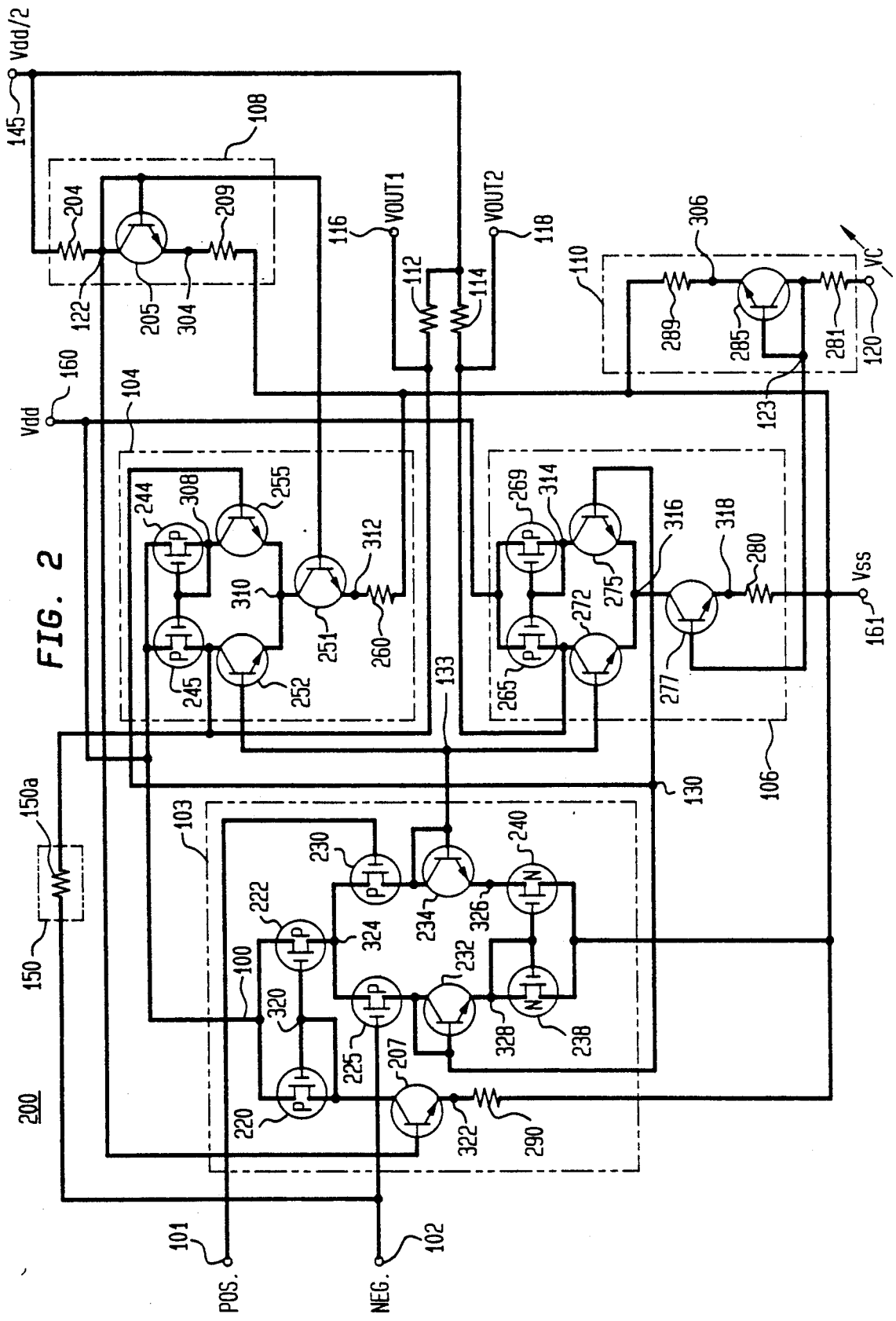
FIG. 2 is a schematic diagram of the operational amplifier of FIG. 1.

Referring now to FIG. 2, there is shown a schematic diagram of an amplifier circuit 200 that may be used as operational amplifier 100 of FIG. 1. Each of the block diagrams of FIG. 1 is shown as a corresponding dashed line rectangle in FIG. 2 with the same reference number used in FIGS. 1 and 2. Each of the circuits of FIG. 2 comprises transistors and resistors coupled together to perform the needed function.

Fixed bias source 108 comprises resistors 204 and 209 and an n-p-n bipolar transistor 205. Variable bias source 110 comprises resistors 281 and 289 and an n-p-n bipolar transistor 285. Differential input amplifier 103 comprises p-channel field effect transistors 220, 222, 225 and 230, n-channel field effect transistors 238 and 240, n-p-n bipolar transistors 207, 232 and 234, and a resistor 290. First output circuit 104 comprises p-channel field effect transistors 244 and 245, n-p-n bipolar transistors 251, 252 and 255 and a resistor 260. Second output circuit 106 comprises p-channel field effect transistors 265 and 269, n-p-n bipolar transistors 272, 275 and 277, and a resistor 280. In an illustrative embodiment, all of the field effect transistors (FET) are typically metal-oxide-semiconductor (MOS) transistors which may be denoted as MOSFETs. In a preferred embodiment the "metal", which is typically used for the gate, is polysilicon. Load impedances 112 and 114 are shown as resistors 112 and 114, respectively, and feedback element 150 is shown as a resistor 150a.

A first terminal of resistor 204 and first terminals of resistors 112 and 114 are coupled to a power supply having a positive output voltage of Vdd/2 and to the terminal 145. The sources of transistors 220, 222, 244, 245, 265 and 269 are coupled to a power supply having a positive output voltage of Vdd and to the terminal 160. First terminals of resistors 209, 260, 280, 289 and 290, and the sources of transistors 238 and 240 are coupled to a reference power supply having a voltage of Vss (typically ground) and to the terminal 161. Input terminal 101 is coupled to the gate of transistor 230. Input terminal 102 is coupled to the gate of transistor 225 and to a first terminal of feedback resistor 150a. Output terminal 116 is coupled to a second terminal of resistor 112, to the collector of transistor 252, to the drain of transistor 245 and to a second terminal of feedback resistor 150a. Output terminal 118 is coupled to a second terminal of resistor 114, to the collector of transistor 272 and to the drain of transistor 265.

A second terminal of resistor 204 is coupled to the collector and base of transistor 205, to the bases of transistors 207 and 251 and to the terminal 122. The emitter of transistor 205 is coupled to a second terminal of the resistor 209 and to a terminal 304.

A first terminal of resistor 281 is coupled to a terminal 120 and to a power supply having a variable output voltage VC which is shown as VC with an arrow therethrough. A second terminal of resistor 281 is coupled to the base and collector of transistor 285, to the base of transistor 277 and to the terminal 123. The emitter of transistor 285 is coupled to a second terminal of the resistor 289 and to a terminal 306.

The gates of transistors 244 and 245 are coupled to the drain of transistor 244, to the collector of transistor 255 and to a terminal 308. The emitters of transistors 252 and 255 are coupled to the collector of transistor 251 and to a terminal 310. The emitter of transistor 251 is coupled to a second terminal of resistor 260 and to a terminal 312. The bases of transistors 232, 255 and 275 are coupled to the collector of transistor 232, to the drain of transistor 225 and to the terminal 130. The bases of transistors 234, 252 and 272 are coupled to the collector of transistor 234, to the drain of transistor 230 and to the terminal 133.

The gate of transistor 265 is coupled to the gate and drain of transistor 269, to the collector of transistor 275 and to a terminal 314. The emitters of transistors 272 and 275 are coupled to the collector of transistor 277 and to a terminal 316. The emitter of transistor 277 is coupled to a second terminal of resistor 280 and to a terminal 318.

The drain and gate of transistor 220 are coupled to the collector of transistor 207, to the gate of transistor 222 and to a terminal 320. The emitter of transistor 207 is coupled to a second terminal of the resistor 290 and to a terminal 322. The drain of transistor 222 is coupled to the sources of transistors 225 and 230 and to a terminal 324. The emitter of transistor 234 is coupled to the drain of transistor 240 and to a terminal 326. The emitter of transistor 232 is coupled to the gate and drain of transistor 238, to the gate of transistor 240 and to a terminal 328.

The fixed bias source 108 of the amplifier 200 of FIG. 2 comprises a voltage divider arrangement connected between Vdd/2 (terminal 145) and Vss (DC ground, terminal 161). A preset voltage Vdd/2 applied to terminal 145 causes a predetermined current to flow through the resistor 204, the diode connected transistor 205 and the resistor 209. A preset voltage proportional to voltage Vdd/2 appears at the commonly connected base and collector (terminal 122) of transistor 205. This preset voltage is supplied to the bias arrangement (i.e., the base of transistor 207) for source coupled transistors 225 and 230 of the differential input circuit 103 of the amplifier 200 of FIG. 2 and to the emitter bias arrangement for emitter coupled transistors 252 and 255 of the first output circuit 104 of the amplifier 200 of FIG. 2. As a result of the preset voltage Vdd/2 at terminal 145, the gains of the differential input circuit 103 and first output circuit 104 portions of the amplifier in FIG. 2 are fixed.

The variable bias source 110 of the amplifier of FIG. 2 comprises a voltage divider arrangement connected between control voltage terminal 120 and Vss (typically DC ground). An adjustable control voltage VC applied to terminal 120 controls the current flow through the resistor 281, the diode connected transistor 285 and the resistor 289. A voltage proportional to the adjustable control voltage VC appears at the commonly connected base and collector (terminal 123) of transistor 285. This adjustable voltage is supplied to the bias arrangement of the output circuit 106 of the amplifier of FIG. 2 including emitter connected transistors 272 and 275. As a result of the adjustable voltage VC, the gain of the second output circuit portion of the amplifier in FIG. 2 may be continuously adjusted in response to the control voltage VC.

In the differential input circuit portion of the amplifier of FIG. 2, input signals POS and NEG are applied to the gates of transistors 230 and 225, respectively. Transistors 225 and 230 operate as a source connected pair to amplify the difference between signals NEG and POS. The current for the sources of transistors 225 and 230 is coupled from the base of transistor 205 of the fixed bias source 108 to source connected transistors 225 and 230 through source bias transistor 207 and current mirror connected transistors 220 and 222. The voltage at the base of transistor 207 is controlled by the voltage at the collector and the base of transistor 205. Since the collector-base path of transistor 207 is connected in series with the source-drain path of transistor 220, the drain current through transistor 220 and the drain current from transistor 222 into terminal 324 is fixed by the voltage VDD/2 at terminal 145. Consequently, the current supplied to the commonly connected sources of transistors 225 and 230 from terminal 324 is predetermined.

Diode connected transistors 232 and 234 and current mirror connected transistors 238 and 240 form an active load for the drains of transistors 225 and 230. The drain of transistor 225 is connected to the drain and gate of transistor 238 through the collector-emitter path of diode connected transistor 232 while the drain of transistor 230 is connected to the drain of transistor 240 through the collector-emitter path of diode connected transistor 234. The differential signal output of the input circuit 103 of the amplifier 200 shown in FIG. 2 appears between the drains of transistors 225 and 230. The gain of the amplifier input circuit 103 in FIG. 2 is determined by the source bias current which is in turn controlled by the base voltage of n-p-n source bias transistor 207. Since this base voltage is fixed, the gain of the input circuit 103 of FIG. 2 is preset at a constant value.

In the first output circuit 104 of the amplifier 200 shown in FIG. 2, the base of n-p-n transistor 252 is connected to the drain of transistor 230 and the base of transistor 255 is connected to the drain of transistor 225. These bases receive the differential output signal from input circuit transistors 225 and 230. The emitters of n-p-n transistors 252 and 255 are connected together at terminal 310 and to a bias arrangement comprising the transistor 257 and the resistor 260 connected between node 310 and Vss. The base of transistor 251 is connected to the base of transistor 205 in the fixed bias circuit 108 of FIG. 2. Consequently, the current through the collector-emitter path of transistor 251 is controlled by the fixed voltage VDD/2 at terminal 145. The gain of the first output circuit 104 is thereby fixed with respect to the circuit bias as is the gain of input circuit 103.

The load circuit for n-p-n transistors 252 and 255 includes current mirror connected transistors 244 and 245 whose sources receive fixed DC voltage Vdd from terminal 160 and load resistor 112 connected between terminal 145 and the collector of n-p-n transistor 252. Transistor 252 also has its collector connected to the drain of transistor 245 as well as to resistor 112. Transistor 255 has its collector connected to the gates of transistors 244 and 245 and to the drain of transistor 244 via terminal 308. Diode connected n-p-n transistors 232 and 234 of input circuit 103, which are connected to the bases of transistors 252 and 255, help prevent saturation of the transistors 251 and 277.

In operation, transistors 252 and 255 of the first output circuit 104 in FIG. 2 convert the differential voltage applied to their respective bases to an output current which flows through load resistor 112 and produces a single ended output voltage VOUT1 at terminal 116. In the event the voltages at the bases of transistors 252 and 255 are balanced (i.e. the same) the drain current through load transistor 245 is the same as the collector current of n-p-n transistor 252. As a result, no current flows through resistor 112 and the voltage VOUT1 at terminal 116 is the same as the voltage at terminal 145, i.e. VDD/2. A differential voltage appearing between the bases of n-p-n transistors 252 and 255 causes a net current flow through resistor 112. A non-zero output voltage VOUT1 then appears at terminal 116 relative to the AC ground at terminal 145. As is well known in the art, feedback element 150 sets the gaIn and assures gaIn stability of the operational amplifier of FIG. 2. In other applications, however, the feedback element is not used or stability may be assured by external feedback elements.

In the second output circuit 106 of the amplifier shown in FIG. 2, the base of transistor 272 is connected to the drain of transistor 230 and the base of transistor 275 is connected to the drain of transistor 225. In this way, the differential output signal from input circuit transistors 225 and 230 is applied to the second output circuit 106. The emitters of n-p-n transistors 272 and 275 are connected together and to a bias arrangement provided at terminal 316. The bias arrangement comprises series connected collector emitter path of n-p-n transistor 277 and resistor 280 connected between terminal 314 and Vss (DC ground). The base of n-p-n transistor 277 is connected to the base of transistor 285 in the variable bias circuit 110 of FIG. 2. Consequently, the current through the collector-emitter path of n-p-n transistor 277 is controlled by adjustable voltage VC at terminal 120. The gain of the second output circuit is thereby rendered adjustable responsive to control voltage VC.

The load circuit for transistors 272 and 275 includes current mirror connected transistors 265 and 269 whose drains receive fixed DC voltage Vdd and load resistor 114 connected between voltage Vdd/2 carrying terminal 145 and the collector of transistor 272. Transistor 272 has its collector connected to the drain of transistor 265 as well as to resistor 114 while the transistor 275 has its collector connected to the drain and gate of transistor 269 and to the gate of transistor 265.

The operation of the second output circuit 106 of the amplifier in FIG. 2 is similar to that described with respect to the first output circuit 104. Transistors 272 and 275 of the second output circuit portion in FIG. 2 convert the differential voltage applied between their respective bases to an output current which flows through load resistor 114 and provides an output signal VOUT2 at terminal 118. In the event the voltages at the bases of transistors 272 and 275 are balanced, the drain current of load transistor 265 is equal to the collector current of transistor 272. Consequently, no current flows through resistor 114 and the voltage VOUT2 at terminal 118 is equal to the voltage at terminal 145 i.e. VDD/2. A differential voltage appearing between the bases of transistors 272 and 275 causes a net output current to flow through resistor 114. A non-zero output voltage VOUT2 then appears at terminal 118.

The adjustable (variable) voltage VC in the circuit of FIG. 2 is received by the adjustable bias source 110 and may be continuously adjustable in response to an external operating parameter. The adjustable voltage VC causes the voltage applied to the base of transistor 277 in second output circuit 106 to vary so that the gain of the second output circuit 106 changes in accordance with the value of control voltage VC. The emitter bias current provided by transistor 277 is varied from a minimum of zero to a maximum equal to the collector current in bias transistor 251 of the amplifier first output circuit 104 in FIG. 2. As a result, the gain of the second output circuit 106 in which emitter coupled transistors 272 and 275 are controlled by n-p-n bias transistor 277 is adjustable between zero and the preset gain of the first output circuit 104 controlled by bias transistor 251.

In an illustrative embodiment Vdd = +8 volts, Vdd/2 = +4 volts, Vss = zero volts and resistors 112, 114, 150, 204, 209, 260, 280, 281, 289 and 290 are 50K, 50K, 1OOK, 36K, 1.8K, 450, 450, 1.8K, 36K, and 1.8K ohms, respectively.

It is to be understood that the specific embodiments described herein are intended merely to be illustrative of the spirit and scope of the invention. Modifications can readily be made by those skilled in the art consistent with the principles of this invention.

The embodiments of the invention in which an exclusive property or privilege is claimed are defined as follows:

1. An amplifier comprising:
   input means for receiving a signal;
   a first type circuit connected to the input means comprising means for amplifying the received signal, means for outputting the amplified received signal, and bias means for controlling the magnitude of the amplified received signal;
   at least two second type circuits each connected to the first type circuit and each comprising means responsive to the amplified received signal from the first type circuit outputting means for forming an output signal, and bias means for controlling the magnitude of the output signal;
   a fixed bias source connected to the bias means of the first type circuit and to the bias means of one second type circuit for setting the bias means of the first type circuit and the one second type circuit to a fixed values;
   means for generating an adjustable control signal;
   at least one adjustable bias source connected between the adjustable control signal generating means and the bias means of other second type circuits responsive to the adjustable control signal for setting the bias means of the second type circuit to a value determined by the adjustable control signal;
   said input means comprising means for receiving one or more input signals;
   said outputting means of the first type circuit comprising means responsive to the one or more input signals for forming a differential signal; and
   each second type circuit comprising means responsive to the formed differential signal from the first type circuit for producing a single ended signal.

2. An amplifier comprising:
   input means for receiving a signal;
   a first type circuit connected to the input means comprising means for amplifying the received signal, means for outputting the amplified received signal, and bias means for controlling the magnitude of the amplified received signal;
   at least two second type circuits each connected to the first type circuit and each comprising means responsive to the amplified received signal from the first type circuit outputting means for forming an output signal, and bias means for controlling the magnitude of the output signal;

a fixed bias source connected to the bias means of the first type circuit and to the bias means of one second type circuit for setting the bias means of the first type circuit and the one second type circuit to a fixed values;

means for generating an adjustable control signal;

at least one adjustable bias source connected between the adjustable control signal generating means and the bias means of other second type circuits responsive to the adjustable control signal for setting the bias means of the second type circuit to a value determined by the adjustable control signal;

means connected between the output signal forming means of the one second type circuit and the input means for feeding back a portion of the output signal of the one second type circuit to the input means to stabilize the gain of the amplifier.

3. The amplifier of claim 2 wherein the magnitude of the output signals of the other of the second type circuits responsive to the adjustable control signal is independent of the output signal of the one second type circuit.

4. A differential operational amplifier comprising:
signal receiving means;
an input circuit connected to the signal receiving means including means responsive to the received signal for forcing a differential signal and bias means for determining the magnitude of the differential signal;
a first output circuit including means responsive to the differential signal for producing a first single ended output signal and bias means for determining the magnitude of the first single ended signal;
at least one additional output circuits each including means responsive to the differential signal for producing an additional single ended output signal and bias means for determining the magnitude of the single ended signal;
a fixed bias source connected to the bias means of the input circuit and to the bias means of the first output circuit for determining a bias operating potential for said differential signal input circuit and for the first output circuit; and
adjustable bias circuit means connected to each additional output circuit for determining a bias potential for the additional output circuit whereby the magnitudes of the additional single ended signals are independently controlled.

5. The differential operational amplifier of claim 4 further comprising means connected between the first output circuit and the signal receiving means for feeding back a signal corresponding to the first single ended signal to the signal receiving means to stabilize the gain of the operational amplifier.

6. The differential operational amplifier of claim 5 wherein the means connected between the first output circuit and the signal receiving means for feeding back a signal corresponding to the first single ended signal to the signal receiving means to stabilize the gain of the operational amplifier is resistive means.

7. The differential operational amplifier of claim 6 wherein the resistive means is a resistor.

8. An amplifier comprising:
a differential input circuit having first and second inputs and first and second outputs;
first and second amplifier input terminals being coupled to the first and second inputs of the differential input circuit, respectively;
first and second output circuits each having a first and second inputs and an output
the outputs of the first and second output circuits being coupled to first and second amplifier output terminals, respectively;
the first and second outputs of the differential input circuit being coupled to the first and second inputs, respectively, of the first output circuit;
the first and second outputs of the differential input circuit being coupled to the first and second inputs, respectively, of the second output circuit;
the differential input circuit and the first output circuit each having a fixed bias terminal which is adapted to be coupled to a fixed bias source; and
the second output circuit having a variable bias terminal which is adapted to be coupled to a variable bias source.

9. The amplifier of claim 8 further comprising feedback means coupled between the output of the first output circuit and the second input of the differential input circuit for providing negative feedback.

10. The amplifier of claim 9 wherein the first input terminal of the amplifier is a positive input and the second input of the amplifier is a negative input.

11. The amplifier of claim 10 wherein the feedback means is the equivalent of a resistor.

12. The amplifier of claim 11 further comprising:
a first load resistor coupled to the output of the first output circuit; and
a second load resistor coupled to the output of the second output circuit.

13. The amplifier of claim 12 further comprising:
a fixed bias source having an output coupled to the fixed bias terminals of the differential input circuit and the first output circuit; and
a variable bias source having an output coupled to the variable bias terminal of the second output circuit.

14. The amplifier of claim 13 wherein the differential input circuit comprises first and second differentially coupled field effect transistors each having a gate which is coupled to a separate one of the first and second amplifier input terminals.

15. The amplifier of claim 14 wherein:
the first output circuit comprises a first pair of emitter coupled bipolar transistors each having a base coupled to a separate output of the first and second field effect transistors; and
the second output circuit comprises a second pair of emitter coupled bipolar transistors each having a base coupled to a separate output of the first and second field effect transistors.

16. The amplifier of claim 15 wherein:
the first output circuit comprises a first essentially constant current source comprising a bipolar transistor having a collector, emitter and base, and a first constant current resistor with the collector of the transistor being coupled to the emitters of the first pair of transistors, the emitter being coupled to the first constant current resistor, and the base being coupled to the fixed bias source; and
the second output circuit comprises a first essentially constant current source comprising a bipolar transistor having a collector, emitter and base, and a second constant current resistor with the collector of the transistor being coupled to the emitters of the second pair of transistors, the emitter being coupled to the second constant current resistor, and the base being coupled to the variable bias source.

17. The amplifier of claim 16 wherein:
the fixed bias source comprises first and second fixed bias source resistors and a fixed bias source bipolar transistor with the first fixed bias source resistor being coupled to a first output terminal and a base terminal of the first fixed bias source bipolar transistor and to the base terminal of the bipolar transistor of the first output circuit; and
the variable bias source comprises first and second variable source resistors and a variable bias source bipolar transistor with the first variable bias source resistor being coupled to a first output terminal and a base terminal of the variable bias source bipolar transistor and to the base terminal of the bipolar transistor of the second output circuit.

18. The amplifier of claim 17 wherein the field effect transistors are p-channel field effect transistors and the bipolar transistors are n-p-n transistors.

19. The amplifier of claim 18 wherein the p-channel field effect transistors are metal-oxide-semiconductor (MOS) p-channel field effect transistors.

* * * * *